United States Patent [19]

Broers et al.

[11] 4,197,332
[45] Apr. 8, 1980

[54] SUB 100A RANGE LINE WIDTH PATTERN FABRICATION

[75] Inventors: Alec N. Broers, Purdys Station; Jerome J. Cuomo, Lincolndale; Robert B. Laibowitz, Peekskill; Walter W. Molzen, Jr., Patterson, all of N.Y.

[73] Assignee: International Business Machines Corporation, Armonk, N.Y.

[21] Appl. No.: 11,360

[22] Filed: Feb. 12, 1979

Related U.S. Application Data

[63] Continuation-in-part of Ser. No. 845,527, Oct. 26, 1977, abandoned.

[51] Int. Cl.$^2$ .............................................. B05D 3/06
[52] U.S. Cl. ................................ 430/272; 430/942; 430/43; 430/314; 430/319; 430/494
[58] Field of Search ................. 427/43; 96/35.1, 36.2, 96/115 R

[56] References Cited

U.S. PATENT DOCUMENTS

| | | | |
|---|---|---|---|
| 3,056,881 | 10/1962 | Schwarz | 219/50 |
| 3,703,402 | 11/1972 | Cole | 427/43 |
| 3,961,099 | 6/1976 | Gipstein et al. | 427/43 |
| 3,964,908 | 6/1976 | Bargon et al. | 427/43 |
| 3,971,860 | 7/1976 | Broers et al. | 427/43 |

OTHER PUBLICATIONS

Molzen et al. to be published in "Journ. Amer. Vac. Soc.," 1979.
Broers, "Microelectronics and Reliability," vol. 4 (1965), pp. 103-104.
Broers et al., "Proceedings Ninth International Congress on Electron Microscopy," vol. 3, pp. 343-354 (8-28-78).
Broers et al., "American Institute of Physics," vol. 44 (1978), pp. 289-297.
Broers et al., "Applied Physics Letters," vol. 33, #5 (Sep. 1978), pp. 392-394.

*Primary Examiner*—John H. Newsome
*Attorney, Agent, or Firm*—Alvin J. Riddles

[57] ABSTRACT

Sub-100Å line width patterns are formed on a member by electron beam conversion and fixing of a resist that arrives at the reaction zone point by surface migration into a resist pattern of a precise thickness and width while the member rests on an electron backscattering control support. The resist is for example a contamination film from a vacuum pump oil used in evacuating the apparatus used to perform the process, e.g. silicone oil.

14 Claims, 7 Drawing Figures

| STEP 1 |
|---|
| PROVIDE THIN FILM TYPE MEMBER SUPPORTED BY NONBACKSCATTERING SUBSTRATE WITH A SURFACE MIGRATING ELECTRON BEAM CONVERTIBLE RESIST IN A THICKNESS LESS THAN THE THICKNESS DIMENSION FOR THE PATTERN TO BE FORMED. |

| STEP 2 |
|---|
| EXPOSE RESIST TO FOCUSED ELECTRON BEAM. PRECISE DIMENSIONS OF RESIST PATTERN MONITORED BY DETECTING NUMBER OF SCATTERED ELECTRONS. |

… # SUB 100Å RANGE LINE WIDTH PATTERN FABRICATION

This is a continuation-in-part of application Ser. No. 845,527, filed Oct. 26, 1977, now abandoned.

DESCRIPTION

TECHNICAL FIELD

As it becomes useful to increase the number of devices included in an individual part of an apparatus, the physical size of each device will become smaller. This trend has been progressing rapidly in the electronic apparatus field such as integrated circuits and magnetic arrays. Through techniques, such as electron beam fabrication, the smallest exploratory devices that have been made are 500Å to 1000Å. Smaller dimensions have not been achievable because of electron scattering effects. The technique of lithography, that is, the formation of a pattern in a resist layer which is later used to protect regions to be differentiated from other regions of a broad area, has produced the narrowest line width patterns that have appeared thus far in the art. An electron beam has been used to alter the properties of a layer of a resist material so that the region where the electron beam strikes the resist can be separated from the remainder of the resist for further processing.

However, as the art developed, and the physical size of the lines in the pattern became smaller, limits began to be encountered even in the fine resolution provided by the electron beam, in that, too much of the resist in an ordinary coating was being irradiated. Through the use of a finely focused electron beam, a resist condensed onto the sample surface from the vapor was polymerized providing a finer line width which through ion beam etching produced a finer pattern. This work was set forth in *Microelectronics and Reliability*, Vol. 4, pp. 103–104, 1965, Pergamon Press. The vapor resist technique produced lines on the order of 500Å. In further development of the art, the effects of electron backscattering from the substrate was also found to be affecting and limiting the resolution of the irradiated resist pattern. A non-backscattering substrate was developed and is described in U.S. Pat. No. 3,971,860. This technology of U.S. Pat. No. 3,971,860 permitted pattern line widths as fine as 300Å.

It is particularly desirable and a substantial breakthrough in device fabrication will be provided when the dimensions become less than 300Å and particularly less than 100Å. In this range of sizes, the dimension of the device for many materials is approaching both the wavelength or scattering length of electrons in conventional semiconductors and the distances involved in such physical processes as quantum mechanical tunnelling, and hence, entirely new devices will be available in the art.

BEST MODE FOR CARRYING OUT THE INVENTION

The present invention allows dimensions below 300Å and into the sub-100Å range to be obtained. Patterns with line widths of less than 100Å are fabricated by electron beam converting and fixing a pattern of resist having precise thickness and width dimensions on a thin film type member that is supported by an electron backscattering control substrate. The resist is present on the surface of the member in a thickness that is less than the required thickness for the desired pattern and arrives at the point of impact of the electron beam reaction zone by surface migration. The electron beam converts and fixes the resist on the surface and through surface migration, the pattern builds to the proper dimensions. Where it is found to be desirable, the surface migrating resist species may be replenished from a vapor should it become depleted during electron beam writing.

Once the resist pattern is formed with the proper dimensions, it may be used, as is, in such applications as selective contacting and light modulation, or, the resist can be employed through an etching operation such as ion etching, to separate a pattern in the thin film type member. The pattern in the thin film type member can in turn then be used in situ or transferred by replication with X-rays for device fabrication.

DISCLOSURE OF INVENTION

Figure 2:
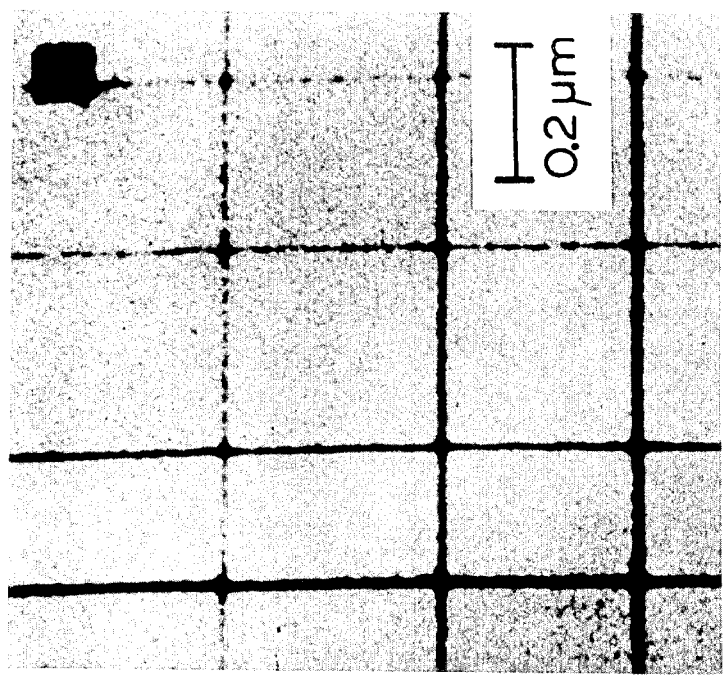
FIG. 2 is an electron micrograph of an 80Å metallic line pattern produced in accordance with the invention.
Figure 1:
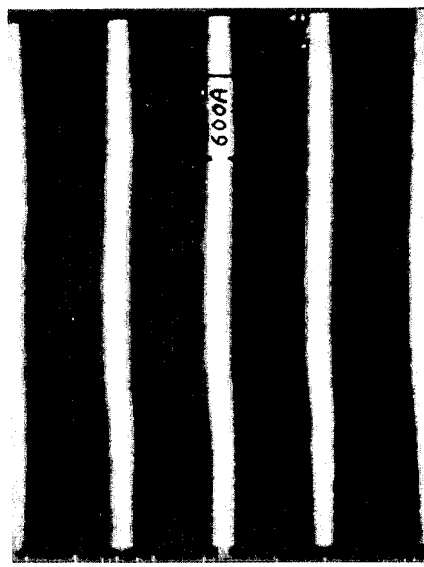
FIG. 1 is an electron micrograph of a metallic 600Å line pattern illustrating the resolution achievable at the present state of the art.

In efforts to provide resolution in pattern line widths in the less than 100Å range it is apparent that, in such a scale, not only is the physical size of importance but also the raggedness of the edges of the lines becomes significant. This may be seen in comparing FIG. 1 labelled "Prior Art" and FIG. 2 wherein the variations in the edge of the 600Å state of the art line of FIG. 1 are greater than the total 80Å line width in FIG. 2. The scales are indicated in the figure.

The technique of the invention involves the use of an electron beam which converts and fixes resist material on the surface of a thin film type member supported by a backscattering control substrate to a precise thickness and width. The precision is achieved by electron scattering control both from the substrate and from the resist itself.

Figure 3:
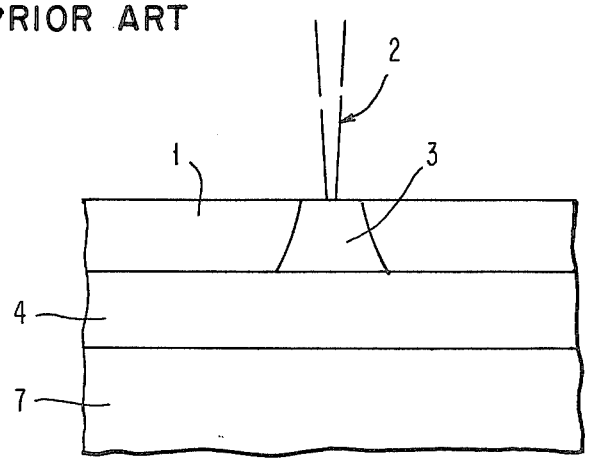
FIG. 3 is a diagram illustrating the scattering effect by electron beam irradiation on a conventional resist layer and substrate.

Referring to FIG. 3 a diagram labelled "Prior Art" is provided. In the diagram the resist 1 is present in a coating with a thickness approaching the ultimate desired thickness dimension. The electron beam 2 is focused on the surface in a small dimension but the irradiated volume due to electron scattering both in the heavy resist layer and in the substrate produce the irradiated volume 3 in the resist which is much larger than the focused electron beam 2.

Figure 4:
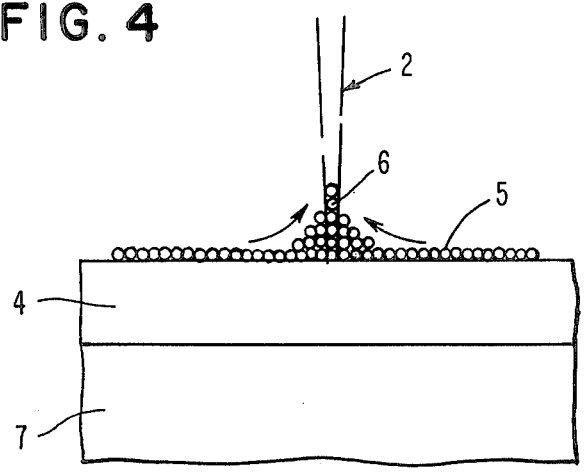
FIG. 4 is a diagram illustrating the resist pattern formation in accordance with the invention.

Referring next to FIG. 4, in accordance with the invention a diagram is provided which illustrates the performance of the resist layer which is thinner than the ultimate required thickness. In FIG. 4 the resist 5 builds upon the surface of the thin film member 4. The resist 5 is converted and fixed to exposed material 6 in the reaction zone at the point of impact of the focused electron beam 2 and further resist 5 arrives by surface migration unitl the required size of converted material 6 is formed. The growth of the converted resist 6 under the beam 2 is primarily vertical with the width progressing at a lower rate. The precision is achieved directly in thickness and indirectly in width. A backscattering control substrate 7 is provided which permits electrons to pass through and escape, and together with only growing as much irradiated resist as required, electron scattering is controlled.

It should be noted that FIG. 4 is merely a schematic explanation of observed results set forth to aid in understanding and should be viewed with an awareness of the limitations in measurement at these sizes.

In accordance with the invention, a resist pattern 6 in the vicinity of about 300Å thick formed on a thin film type member 4 supported so that electrons do not scatter back into the resist from the substrate 7 will produce patterns with sub-100Å line widths.

Figures 5, 6:
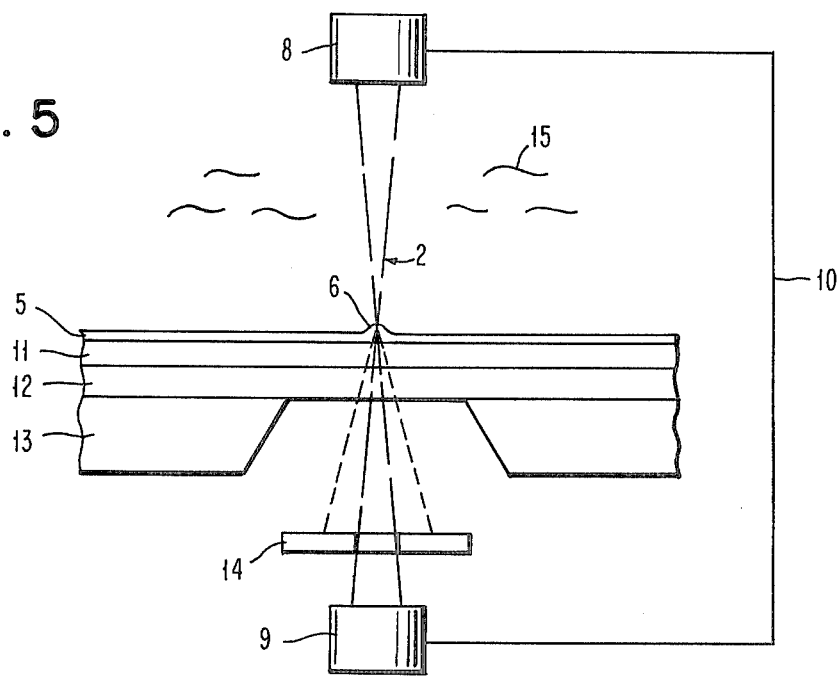
FIG. 5 is a schematic diagram showing the general arrangement of the electron beam fabrication apparatus employed in the invention.
FIG. 6 is a chart of steps employed in fabricating the metallic pattern lines in accordance with the invention.

Referring next to FIG. 5 there is shown a functional schematic diagram of an apparatus for practicing the invention. The apparatus involves a focused electron beam 2 from a source 8 having the output thereof controlled by a monitor 9 through a communication medium functionally shown as a cable 10. A thin film type member 11, which is preferably a metal layer is positioned on a non-electron backscattering substrate 12 which in turn is resting on a support grid 13, all positioned such that a resist 5 present in a thickness less than the required dimension for the pattern to be formed grows in the reaction zone at the point of impact of the electron beam 2 to a greater precisely selectable thickness and width 6. The duration of the electron beam 2 and hence the height and width of the resist pattern 6 is controlled by monitoring the number of electrons that are scattered. In FIG. 5 this is illustrated by monitoring the amount of the electron beam 2 that passes through aperture 14 and reaches the monitor 9. Other ways of monitoring resist buildup are detecting forward or backward scattered electrons and secondary electrons. With the apparatus of FIG. 5, the electron beam 2 converts and fixes just enough resist to provide the desired pattern 6 in thickness. As the resist pattern increases in height it becomes wider and this effect can be correlated with line width. The thin substrate 12 permits the electrons to pass through and not be scattered back to provide uncontrolled resist irradiation.

The electron beam 2 is focused so that in the absence of resist it substantially passes through the aperture 14 to the monitor 9. When the resist 6 builds to the desired height and hence width, the grown resist itself produces electron scattering which causes less electrons to pass through the aperture 14. This is illustrated by dashed lines in FIG. 5. On a scale of 100% electrons sensed before resist growth, when the monitor 9 senses, for example 80%, then 20% of the electrons are being scattered by the grown resist and the grown resist 6 will now be thick enough and wide enough. The amount of change of electrons monitored will vary with the materials involved and one skilled in the art can readily establish an appropriate variation. At this point the monitor 9 communicates to the source 8 through the communication medium 10 to stop the electron beam 2. Should it be desirable to replenish the resist as it surface migrates to the reaction zone at the point of impact of the electron beam, this is preferably done by providing an environmental source such as a vapor 15.

The sequence of steps involved in the technique of the invention is illustrated in connection with FIG. 6 wherein a flowchart sets forth the steps involved. The following discussions of the steps are correlated with the apparatus of FIG. 5.

Referring to Step 1, a thin film type member 11, preferably a metal layer, on which the desired pattern is ultimately to be formed is provided on a suitable backscattering control substrate 12. The backscattering control substrate 12 is strong enough to support the metal 11, is thin enough and is supported at 13 sufficiently far away such that scattered electrons escape and are not reflected back to provide undesired irradiation of the resist. A carbon film may be used as the substrate 12 that is from 10Å to 1000Å thick having a support grid 13 with openings that are 125 microns × 125 microns. Some other substrate materials that are suitable are Si, $Si_3N_4$, $SiO_2$, $Al_2O_3$, and polyimide and collodion.

Substrates of 60 nm thick $Si_3N_4$ membranes are particularly advantageous. The substrates may be prepared as follows. <100> oriented, 2 ohm-cm, N type silicon wafers 200 $\mu$m thick are thermally oxidized on both sides to a thickness of 500 nm by the well known dry-wet-dry chemical process. After masking the back rough surface of the wafer with a conventional photoresist such as that known in the trade as AZ1350J, the oxide is removed from the front smooth surface with a solution of 9:1 buffered HF which has an etch rate of 63 nm/min. About 100 nm of $Si_3N_4$ is then chemically vapor deposited on the front surface of the wafer at 810° C. using $SiH_4$ and $NH_3$ as the reactant gases. A pattern is then etched into the $SiO_2$ on the back rough surface of the wafer using buffered HF and conventional photoresist techniques. The $Si_3N_4$ does not have to be masked because only about 20nm is removed during the HF etch.

The wafers are then put into buffered HF for 10 seconds to remove the native oxide just before using an anisotropic silicon etching technique to produce the silicon truncated pyramid support structure of element 13 in FIG. 5. Anisotropic etching is accomplished in a mixture of 40 g of pyrocatechol, 250cc of ethylenediamine, and 80 cc of water, at the mixture boiling point of 118° C. in a water cooled reflux apparatus. The 200 $\mu$m thick silicon wafer is etched through the $SiO_2$ mask completely to the $Si_3N_4$. Only 20 nm of $Si_3N_4$ will be removed during the process at a rate of 8.5 nm/hr since $SiO_2$ etches at 17 nm/hr. It may be seen that silicon is advantageous for the support structure 13 because of the large difference in etch rates between the <100> direction in silicon (50 $\mu$m/hr), and the <110> direction (30 $\mu$m/hr) and <111> directions (3 $\mu$m/hr). Substrate 12 membranes up to 1 micron thick are acceptable for substrate use. However, for ultra high resolution structure, membranes less than 150 nm thick are typically used. The substrate 12 when mounted with an adjacent 200 $\mu$m thick Si support 13 can be spincoated with a resist in a vacuum chuck without breakage.

It is essential only that the resist 5 be converted by the electron beam 2 and that the conversion in width and thickness be controllable and that the grown resist 6 is of precise dimensions. The pattern 6 may be used as is, or it may serve in a subsequent processing step as a basis to delineate a final pattern from the rest of the film type layer 11. The resist 5 must have the properties of conversion and fixing in the presence of an electron beam and the ability to migrate across the surface. A satisfactory resist material is the class of materials known in the art as contamination resists. One contamination type of resist is the vapor present from the silicone oil usually employed in oil diffusion pumps. This is presumed to be a silicone vapor. Many organic materials when applied as in a thin enough layer 5 can be altered by an electron beam and thereby converted and fixed and hence are suitable for this type of resist formation. The mechanism by which the electron beam converts the material into a resist is not fully understood at this time. The thickness dimension less than the ultimate pattern thickness may be achieved, for example, from the vapor or by spinning on a dilute resist liquid and is in the vicinity of 100 nanometers.

In the case of the class of materials known as contamination resists, two sources are useable: background oil vapors present in the vacuum system and intentionally deposited vacuum pump oils. Background oil vapors are useable to prepare as small as 8 nm wide and 10 nm thick $Pd_{40}Au_{60}$ lines. The resist 5 is formed from a vapor of oil in the system on 10 nm thick carbon substrate 12 membrane. A perspective of the care required may be gained from the fact that although the electron beam diameter is less than 1 nm, lines in the vicinity of 8 nm wide are obtained.

In order to enable one skilled in the art to select an appropriate contamination resist 5 the following tables are provided. TABLE 1 describes the resist 5 formation of four typical diffusion pump oils correlated with the electron exposure dose on two types of substrate 12.

TABLE 1

| Oil | Electron exposure dose (C/cm) | |
|---|---|---|
| measured | on Si | on $Pd_{40}Au_{60}$ |
| Convoil-20 | $4.8 \times 10^{-5}$ | $7.4 \times 10^{-6}$ |
| DC704 | $7.0 \times 10^{-6}$ | $8.7 \times 10^{-7}$ |
| DC705 | $6.1 \times 10^{-7}$ | $5.9 \times 10^{-7}$ |
| Santovac-5 | $6.3 \times 10^{-7}$ | $6.3 \times 10^{-7}$ | where DC704 and DC705 are products of the Dow Corning Corporation; and

Convoil-20 is a product of The Bendix Corporation, and Santovac-5 is a product of The Monsanto Corporation.

The criteria for a resist 5 material that would facilitate practice of the invention are the rate of formation in an electron beam and the tolerance to ion milling when desired structure pattern is separated from the layer 11.

TABLE 2 describes the resistance to ion milling properties of a 30 nanometer thick $Pd_{40}Au_{60}$ film at 5 kV and 0.5 ma/cm.

TABLE 2

| Oil measured | Oil deposited (ml of Argon) | Electron dose (C/cm) at milling times of: | | |
|---|---|---|---|---|
| | | 2.5 min | 3 min | 5 min |
| Convoil-20 | 0.6 | $7.4 \times 10^{-6}$ | $7.4 \times 10^{-6}$ | $7.4 \times 10^{-6}$ |
| DC704 | 5.2 | $8.7 \times 10^{-7}$ | $8.7 \times 10^{-7}$ | $7.7 \times 10^{-6}$ |
| DC705 | 360 | $1.8 \times 10^{-6}$ | $1.8 \times 10^{-6}$ | $7.0 \times 10^{-6}$ |
| Santovac-5 | 551 | $2.1 \times 10^{-6}$ | $3.1 \times 10^{-6}$ | $3.0 \times 10^{-5}$ |

From the tables it will be apparent that Dow Corning silicone oil type DC705 is the best of the oils because it has a high rate of formation of contamination resist deposition in the electron beam and it will last the longest when subjected to ion beam etching. The DC705 oil is tetraphenyl-tetramethyl-trisiloxane. The contamination resist may exhibit low sensitivity and depletion effects when writing dense metal patterns and hence a limitation is present on forming dense patterns for these reasons. These effects can be offset by replenishing the oil in the vapor or on the surface.

Figure 7:
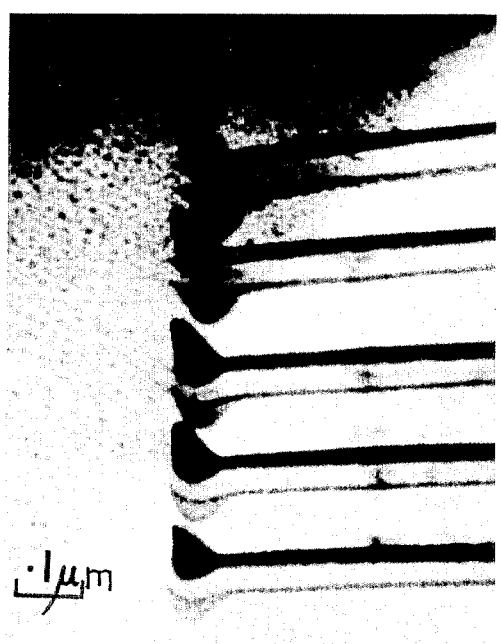
FIG. 7 is an electron micrograph of resist indicating variations in thickness.

The resist pattern 6 will, as shown schematically in FIG. 4, exhibit a high aspect ratio in the vicinity of 3:1 and care should be used to provide a uniform motion of the beam. The effect of a difference in time under the beam may be seen in connection with FIG. 7 wherein the cones that are much higher than the lines are formed when the beam remains on one spot for an extended time.

Referring next to Step 2 in FIG. 6, since the goal is to produce a pattern by using the electron beam 2 in the reaction zone at the point of impact to grow the surface migrating resist 5 to a precise thickness and width pattern 6, the scattering of the electrons are a measure of the dimensions. Control can be achieved by the electron beam 2 intensity but since the electron beam 2 has several functions to perform in connection with the conversion of the resist 5, the preferred method of control is the use of a monitor 9 with an aperture 14 that measures electron scattering by the growing resist. Other methods of electron scattering monitoring in the light of the principles set forth will be readily apparent including monitoring secondary electron scattering.

The resulting resist pattern may be used, as is, for such applications as electrical contact control and light modulation. If desired, for example, in semiconductor applications directly on the crystal, separation of the pattern from the member 11 may be accomplished by ion or chemical etching wherein the resist pattern 6 serves as a delineating member to control the etching operation.

The resulting 100Å range pattern may further then be used in situ or it may, through the use of X-ray irradiation in the 20Å to 50Å wavelength range, be used as a mask in the transfer of the pattern to another substrate for device formation.

The term "resist" has been used in accordance with the general use of the term in the art because in most applications the pattern is used for further etching delineation even though there are applications where the pattern is used directly.

What has been described is a technique of forming patterns of lines in the sub-100Å range wherein the width and edge resolution are achieved by forming by electron beam conversion and fixing a width and thickness controlled resist on a thin fill backscattering controlled layer wherein the resist is the product of a monitored growth from a layer that is less than the thickness required for the desired pattern.

Having described the invention, what is claimed as new and what is desired to secure by Letters Patent is:

1. In the formation of patterns by the process of electron beam irradiation of resist material, the improvement comprising providing surface migratable resist material in a thickness less than the thickness required for the pattern to be formed.

2. In the formation of patterns by the process of electron beam irradiation of resist material the improvement comprising the use of the combination of a backscattering control substrate with a surface migratable resist material provided in a thickness less than the thickness required for the pattern to be formed.

3. The improvement in the electron beam formation of resist patterns of claim 2 wherein said resist material is provided from a vapor source.

4. The process of forming patterns comprising in combination the steps of providing a thin film type member supported by a non-electron backscattering substrate with an electron beam convertible resist having a thickness less than the thickness required for the pattern to be formed; and exposing the resist to a focused electron beam for a time sufficient to irradiate the resist to the required pattern dimensions.

5. The process of claim 3 wherein said exposing step includes the step of monitoring scattered electrons to control time of said exposing step.

6. The process of claim 5 including the step of separating a pattern from said thin film type member by etching.

7. The process of forming patterns comprising in combination:

placing a resist capable of surface migration and electron beam conversion and fixing on a thin film type member in a thickness less than the thickness dimension required for the pattern to be formed, supporting the thin film type member with a non-electron backscattering substrate; and exposing the resist to a focused electron beam until the required pattern thickness dimension is reached.

8. The process of claim 7 wherein said exposing step includes the step of exposure duration control by monitoring electron scattering by the converted and fixed resist.

9. The process of claim 8 including the step of separating the pattern from said thin film type member by etching.

10. The process of claim 9 wherein said non-electron backscattering substrate is a member of the group of Si, $Si_3N_4$, $SiO_2$, $Al_2O_3$, polyimide, collodion and carbon.

11. The process of claim 10 wherein said resist is an organic material.

12. The process of claim 11 wherein said resist is silicone oil.

13. The process of claim 11 wherein said resist is tetraphenyl-tetramethyl-trisiloxane.

14. The process of claim 10 wherein said pattern separation is done by ion etching.

* * * * *